United States Patent
Strasser

(10) Patent No.: US 10,215,792 B2
(45) Date of Patent: Feb. 26, 2019

(54) POSITION-MEASURING DEVICE, CONNECTABLE VIA A DATA-TRANSMISSION CHANNEL TO TRANSMIT DATA, INCLUDING A DETECTION UNIT ADAPTED TO DETECT PRESENCE, OR NON-PRESENCE OF A PAIR OF LINES

(71) Applicant: Dr. Johannes Heidenhain GmbH, Traunreut (DE)

(72) Inventor: Erich Strasser, Trostberg (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 460 days.

(21) Appl. No.: 13/758,588

(22) Filed: Feb. 4, 2013

(65) Prior Publication Data

US 2013/0207666 A1    Aug. 15, 2013

(30) Foreign Application Priority Data

Feb. 3, 2012  (DE) .................. 10 2012 201 651

(51) Int. Cl.
*G01R 31/04* (2006.01)
*G01R 31/02* (2006.01)
*G01D 5/244* (2006.01)

(52) U.S. Cl.
CPC .......... *G01R 31/041* (2013.01); *G01D 5/244* (2013.01)

(58) Field of Classification Search
CPC ........ G01D 5/244; G01D 3/08; G05B 19/042; G01R 31/041; G01R 31/2827;
(Continued)

(56) References Cited

U.S. PATENT DOCUMENTS 4,764,759 A      8/1988  Braun et al.
5,101,155 A  *   3/1992  Oehler ................. G01P 21/02
                                                           324/160
(Continued)

FOREIGN PATENT DOCUMENTS

CN      101005380 A      7/2007
CN      102033187 A      4/2011
(Continued)

OTHER PUBLICATIONS

Machine Translation of DE 102008054887, Mayer et al. Jul. 1, 2010.*

(Continued)

*Primary Examiner* — Lee Rodak
(74) *Attorney, Agent, or Firm* — Hunton Andrews Kurth LLP

(57) ABSTRACT

A position-measuring device for determining the position of two objects movable relative to each other, which during operation, generates data in the form of measured position values, and which is to be connected to a processing unit via a data-transmission channel in order to transmit data, the position-measuring device being able to be connected to the processing unit via a first pair of lines, or alternatively, via a first pair of lines and at least one further pair of lines. The position-measuring device is assigned a detection unit with which the presence or non-presence of at least one further pair of lines is detectable, when the position-measuring device is connected to the processing unit via the data-transmission channel.

16 Claims, 4 Drawing Sheets

(58) Field of Classification Search
CPC .............. G01R 31/2829; G01R 31/043; G01R 31/045; G01R 31/046; B60L 3/0069
USPC .............. 324/538, 750.16, 270.11, 176, 326, 324/207.11, 522, 525, 526, 527, 539, 601, 324/60, 5, 606, 609, 691, 705, 710, 713, 324/1.79, 114.26, 114.36; 701/11, 12, 14, 701/15, 16, 18, 19, 62–64, 72, 104, 10; 702/94, 95, 150–153; 73/1.79, 114.26, 73/114.36
See application file for complete search history.

(56) References Cited

U.S. PATENT DOCUMENTS

| | | | |
|---|---|---|---|
| 5,687,103 | A | 11/1997 | Hagl et al. |
| 5,757,265 | A | 5/1998 | Kogure et al. |
| 6,373,262 | B1* | 4/2002 | Herring ............... H04L 25/0272 324/539 |
| 6,421,628 | B1* | 7/2002 | Thorsander et al. ......... 702/150 |
| 6,456,085 | B1* | 9/2002 | Dietl .................... B60L 3/0069 324/509 |
| 7,768,418 | B2 | 8/2010 | Nordin |
| 8,154,305 | B2 | 4/2012 | Carter et al. |
| 2006/0176044 | A1* | 8/2006 | Binder et al. ................ 324/71.1 |
| 2007/0001683 | A1* | 1/2007 | Krigel ........................... 324/503 |
| 2010/0023744 | A1* | 1/2010 | Markel ............... G06F 13/4081 713/2 |
| 2010/0295553 | A1* | 11/2010 | Nordin .......................... 324/538 |
| 2011/0081154 | A1* | 4/2011 | Ueda ............................... 399/13 |
| 2011/0116501 | A1 | 5/2011 | Beaury et al. |
| 2011/0258358 | A1 | 10/2011 | Mayer et al. |
| 2012/0013345 | A1* | 1/2012 | Carter et al. .................. 324/538 |

FOREIGN PATENT DOCUMENTS

| | | |
|---|---|---|
| CN | 102257446 A | 11/2011 |
| CN | 102338839 A | 2/2012 |
| DE | 10 2008 027 902 | 12/2009 |
| DE | 10 2008 054 887 | 7/2010 |
| EP | 0 171 579 | 2/1986 |
| EP | 0 660 209 | 6/1995 |
| JP | S57211693 A | 12/1982 |
| JP | H03164899 A | 7/1991 |
| JP | H04170824 A | 6/1992 |
| JP | H04-207329 A | 7/1992 |
| JP | H0638269 A | 2/1994 |
| JP | H06103485 A | 4/1994 |
| JP | H11-45130 A | 2/1999 |
| JP | 2000-349754 A | 12/2000 |
| JP | 2004295276 A | 10/2004 |
| JP | 2008-242863 A | 10/2008 |
| JP | 2008250997 A | 10/2008 |
| WO | WO-2010069664 A1 | 6/2010 |

OTHER PUBLICATIONS

English Machine Translation of Saito JPH1145130, Published Feb. 16, 1999.*

* cited by examiner

POSITION-MEASURING DEVICE, CONNECTABLE VIA A DATA-TRANSMISSION CHANNEL TO TRANSMIT DATA, INCLUDING A DETECTION UNIT ADAPTED TO DETECT PRESENCE, OR NON-PRESENCE OF A PAIR OF LINES

CROSS-REFERENCE TO RELATED APPLICATIONS

The present application claims priority to Application No. 10 2012 201 651.1, filed in the Federal Republic of Germany on Feb. 3, 2012, which is expressly incorporated herein in its entirety by reference thereto.

FIELD OF THE INVENTION

The present invention relates to a position-measuring device.

BACKGROUND INFORMATION

Position-measuring devices may be used to determine the position of two objects movable relative to each other, and during operation, generate (electrical) output signals which are supplied (in digital form) as measured position values (position data) to a control and processing unit, in which the measured position values are evaluated and used, for example, to control a machine tool. Conversely, the control and processing unit also transmits data regularly to the position-measuring device, for instance, in the form of position-request instructions which trigger the transmission of measured position values from the position-measuring device to the control and processing unit, or in the form of parameter data, which is important for the operation of the position-measuring device. Thus, a position-measuring device for determining the position of two objects movable relative to each other may be connected via a data-transmission channel to a control and processing unit.

The data-transmission channel, which produces a physical connection between the position-measuring device and the control and processing unit and thereby permits data to be transmitted between those two modules, together with the rules of the data transmission denoted as a protocol, is also referred to as interface.

Various interfaces may be used for transmitting data between a position-measuring device and an associated control and processing unit. The type of interface used may depend, first of all, on whether the position-measuring device is an incremental position-measuring device with which changes in position between two objects movable relative to each other are determined, from which absolute positions may possibly also be determined by referring to a reference position (which is ascertainable in an initial reference execution of the position-measuring device), or whether it is an absolute position-measuring device with which the position of one of the two objects relative to the other of the two objects is ascertainable directly. Moreover, even in the case of a selected type of a position-measuring device (absolute or incremental), however, different interfaces are used for the connection to a control and processing unit.

For example, serial interfaces are used for the most part for transmitting absolute measured position values from a position-measuring device to a control and processing unit, since they are able to achieve high data-transmission rates using only a few data-transmission lines. This holds true especially for what are called synchronous serial interfaces, which have a unidirectional or bidirectional data line and a clock line. In that case, data packets are transmitted on the data line in synchronism with a clock signal on the clock line. Examples for such synchronous serial interfaces are referred to as the EnDat interface and the SSI.

The SSI interface is described, for example, in European Patent Application No. 0 171 579. It is in the form of a synchronous serial interface having a unidirectional data line and a unidirectional clock line. Measured position values are read out from a position-measuring device in synchronism with a clock signal on the clock line.

The fundamentals of the EnDat interface are explained in European Published Patent Application No. 0 660 209. It is likewise a synchronous serial interface which, however, besides a unidirectional clock line, has a bidirectional data line. Data is thereby able to be transmitted in both directions, e.g., from the position-measuring device to the control and processing unit, and conversely, from the control and processing unit to the position-measuring device. The data is transmitted in synchronism with a clock signal on the clock line, as well.

When using the two aforesaid interfaces, the position-measuring device is connected in each case to the control and processing unit via a data-transmission channel which is formed by two pairs of lines. In contrast, German Published Patent Application No. 10 2008 027 902 describes an interface version where the position-measuring device is connected to the control and processing unit via only one pair of lines.

Accordingly, to form a data-transmission channel, a position-measuring device is connectable via a first pair of lines, or alternatively, via a first and at least one further (second) pair of lines to a control and processing unit, in order to be able to transmit data.

The control and processing unit is also referred to herein as a processing unit, because the reception and processing of data, obtained from the position-measuring device and transmitted via a data-transmission channel (interface), are among important functions of that unit. Moreover, it may also be used to control the position-measuring device on one hand, and/or, on the other hand, a machine tool or other assembly which is to be controlled as a function of the data obtained with the aid of the position-measuring device.

German Published Patent Application No. 10 2008 054 887 describes a device and a method for the automated differentiation of the two first-named interfaces, each of which includes a data-transmission channel having two pairs of lines. However, this method is not readily usable for detecting interfaces having a different number of line pairs.

SUMMARY

Example embodiments of the present invention improve the interface recognition in the case of a position-measuring device.

According to example embodiments of the present invention, the position-measuring device is assigned a detection unit with which it is (especially) ascertainable whether the data-transmission channel or interface via which the position-measuring device is presently connected to a control and processing unit is one having only one pair of lines or one having two (or more) pairs of lines.

A subsequent more precise identification of the interface, as described, for example, in German Published Patent Application No. 10 2008 054 887, may thereby be simplified.

In particular, the detection unit may be integrated into the position-measuring device.

Furthermore, the detection unit may be adapted such that, in addition to determining a first pair of lines (necessary for the data transmission) as component of the data-transmission channel or interface, it also ascertains whether a second pair of lines (and possibly even a third or fourth pair of lines) is present.

To that end, the detection unit may be equipped to detect a voltage difference between the lines of the further pair of lines, particularly including a comparison of the ascertained voltage difference to a threshold value.

For example, the detection unit may be arranged such that, for example, using it, it is possible to detect a terminating resistor of a pair of lines on the side of the control and processing unit. This arrangement is based on the appreciation that the serial transmission of data between a position-measuring device and an associated control and processing unit is often carried out differentially, e.g., according to the RS-485 standard. In the case of a differential data transmission, a terminating resistor is provided on the receiver side, e.g., particularly on the side of a control and processing unit which is intended to receive measured position values, in order to avoid reflections on the line.

The arrangement described herein is usable in general for detecting a pair of lines that has a terminating resistor, so that by detecting that resistor, the detection unit is able to infer the presence of a corresponding pair of lines in the data-transmission channel, i.e., in the interface between the position-measuring device and the processing unit.

The presence of a terminating resistor in a pair of lines on the side of the processing unit may be detected, for example, by checking with the aid of the detection unit whether an electric circuit is able to be formed via a current path in which, given the presence of the corresponding pair of lines and the associated terminating resistor, the latter would have to be situated.

Thus, the presence of a specific pair of lines as well as the associated terminating resistor may be ascertained with the aid of a detection unit, for instance, by the attempted energizing of the pair of lines and the terminating resistor including a current measurement and/or by attempted pick-off of a voltage level at the terminating resistor.

In particular, the presence of a specific pair of lines in the data-transmission channel, i.e., in the interface between the position-measuring device and the processing unit, may be determined by the fact that the detection unit has a comparator which compares the voltage level of one of the lines of the pair of lines (with which the terminating resistor is connected) to a reference level.

The detection unit may be adapted to ascertain (measure) the characteristic impedance, i.e., the impedance, or the reflection properties of the lines of the further pair of lines to be detected.

Further features and aspects of example embodiments of the present invention are described in more detail below with reference to the appended Figures.

DETAILED DESCRIPTION

Figure 1:
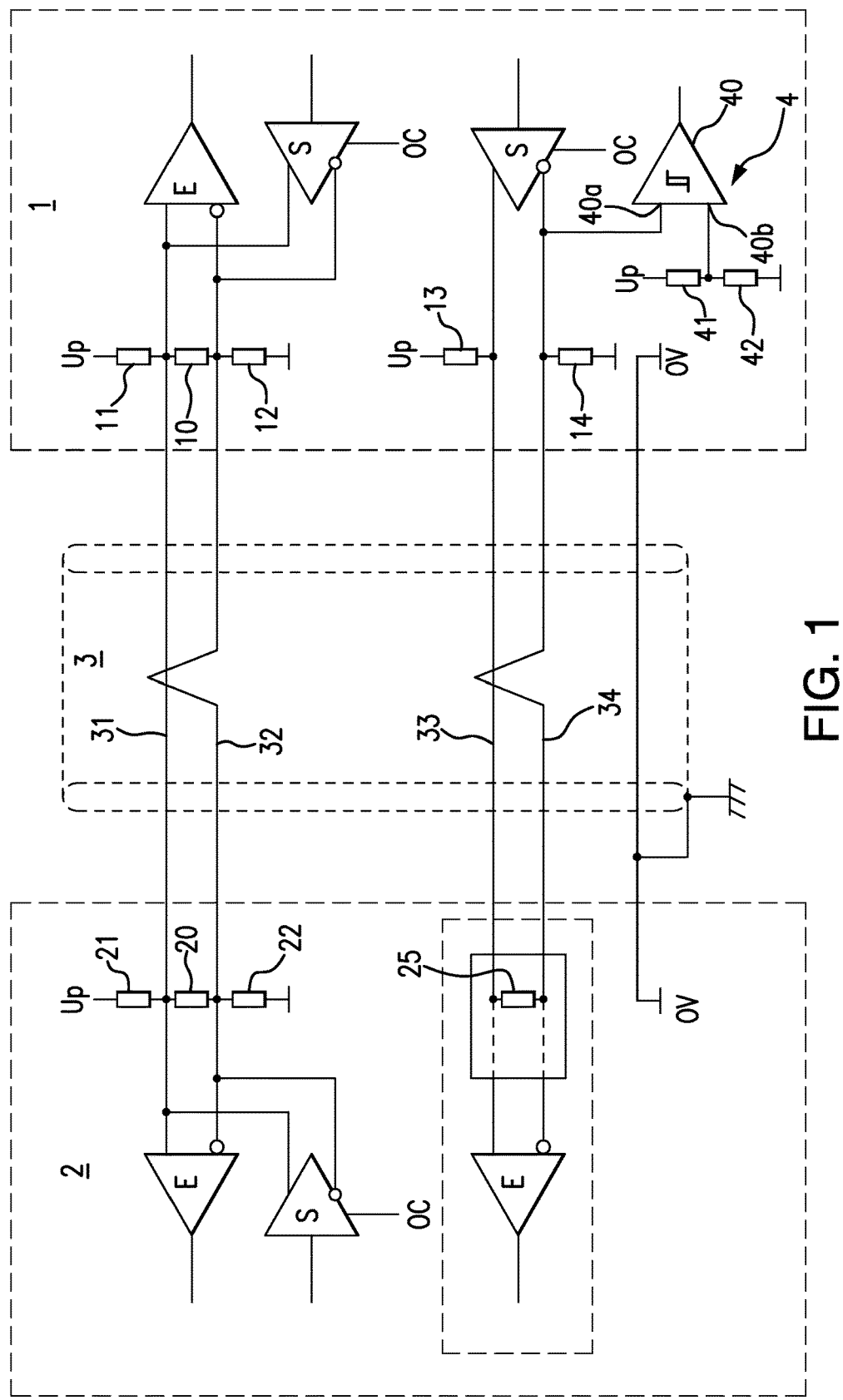
FIG. 1 schematically illustrates a position-measuring device and an associated control and processing unit which are connected to each other via a data-transmission channel.

In a block diagram, FIG. 1 schematically illustrates a position-measuring device 1 as well as a control and processing unit 2 in the form of a numerical machine-tool control, for example, that are connected to each other via a data-transmission channel 3.

Via data-transmission channel 3, position-measuring device 1 and control and processing unit 2 (hereinafter referred to as a processing unit) are able to exchange data, for example, in the form of position data (measured position values) that are sent by position-measuring device 1 to processing unit 2, as well is in the form of instructions, e.g., position-request instructions, which are sent by processing unit 2 to position-measuring device 1. Data-transmission channel 3, which produces a physical connection between position-measuring device 1 and processing unit 2 for the purpose of transmitting data, as well as the protocol which contains the rules for that data transmission (interface protocol) are referred to as an interface.

Different interface arrangements may be provided for the data transmission between position-measuring device 1 and processing unit 2, which may differ first of all, in the (physical) form of data-transmission channel 3 and/or secondly, in the associated interface protocol.

Data-transmission channel 3, i.e., the interface taken as a whole, must ensure in each case that the output signals (measured position values or position data) generated by position-measuring device 1 during its operation are able to be transmitted by it via data-transmission channel 3 to associated processing unit 2. Moreover, data-transmission channel 3 as well as the interface formed by it are able to support or allow the transmission of further data from position-measuring device 1 to processing unit 2, such as the transmission of temperature data or data which characterizes the operating state of position-measuring device 1.

In addition, data-transmission channel 3 as well as the interface formed by it are also able to allow the transmission of data from processing unit 2 to position-measuring device 1, for instance, in the form of position-request instructions with which processing unit 2 requests instantaneous position data from position-measuring device 1. This corresponds to an arrangement of the system illustrated in FIG. 1 as a master-slave system, in which processing unit 2 assumes the function of the master and position-measuring device 1 assumes the position of the slave. That is to say, the data transmission between those two units 1, 2 is initiated in each instance by processing unit 2, e.g., by sending position-request instructions, while position-measuring device 1 reacts to those instructions, e.g., by sending instantaneous position data. However, such an arrangement of the system illustrated in FIG. 1 as master-slave system is not necessary. It is important that at least the output signals of position-measuring device 1 in the form of measured position values (position data) are able to be transmitted in suitable manner from position-measuring device 1 to processing unit 2.

As in the case of the data transmission from position-measuring device 1 to processing unit 2, which in addition to the aforesaid position data, may also include the transmission of further data such as temperature data, the data transmission possibly provided from processing unit 2 to position-measuring device 1 may also include data linked to the position measurement such as the position-request instructions already mentioned, on one hand, as well as further data such as parameter data, for example, on the other hand. The latter may be used, for instance, to supply specific parameters to the position-measuring device which are important for its operation.

The various data able to be exchanged between a position-measuring device and a processing unit during operation are generally conventionally and are therefore not explained in greater detail herein. In this regard, reference is made, for example, to European Published Patent Application No. 0 171 579 and European Published Patent Application No. 0 660 209, each of which is expressly incorporated herein in its entirety by reference thereto, where the data transmission between a position-measuring device and an associated processing unit is described in detail for two different types of interface.

Let us assume, for example, that by scanning a measuring standard with the aid of a scanning unit, position-measuring device 1 generates position signals that are converted into digital measured position values or position data and transmitted via data-transmission channel 3 to processing unit 2. The physical principle underlying the scanning is not important. For example, optical, magnetic, or inductive measuring principles may be used. In addition to the position data, further data may be generated in position-measuring device 1 such as, for example, measured values such as speed or acceleration resulting from the relative movement between the scanning unit and the measuring standard. However, the further data may also involve measured values relating to environmental conditions such as temperature or pressure values. Finally, status information may also be made available as further data, e.g., in the form of status bits or status words that signal warning conditions or fault conditions.

The present example concerns detecting, with the aid of a detection unit, the number of pairs of lines (as components of data-transmission channel 3) via which position-measuring device 1 and processing unit 2 are connected to each other, for which the type of data transmitted via data-transmission channel 3 is not of fundamental importance.

The block diagram of FIG. 1 shows only the driver modules (transmitters S) and receiver modules (receivers E) of position-measuring device 1 and processing unit 2, respectively, with which data is able to be transmitted and received, data-transmission channel 3 serving as the data-transmission medium between position-measuring device 1 and processing unit 2. The basic configuration of a position-measuring device as well as of an associated processing unit are likewise generally familiar and described many times, and in the present case are therefore not of special interest with regard to the specifics, because the concern here, in particular, is the detection of the number of pairs of lines 31, 32; 33, 34 of transmission channel 3, not, however, details regarding the configuration of a position-measuring device 1 and an associated processing unit 2. Rather, it is important that position-measuring device 1 is able to transmit output signals (measured position values or position data) generated during a position measurement, as well as possibly further data via data-transmission channel 3 to processing unit 2, and that if applicable, processing unit 2 is able to transmit instructions as well as further data to position-measuring device 1. Transmitter and receiver modules S, E of position-measuring device 1 and processing unit 2, respectively, illustrated in FIG. 1, are used for that purpose. A detailed description of such a system may be found, for example, in German Published Patent Application No. 10 2008 054 887, which is expressly incorporated herein in its entirety by reference thereto.

Data-transmission channel 3 may be configured for a serial data transmission. That is, it includes at least one serial data connection. Furthermore, in the present example, the data is to be transmitted differentially, e.g., according to the RS-485 standard. Thus, a particular intended data connection of data-transmission channel 3 is in the form of a pair of lines 31, 32; 33, 34, to which on the side of position-measuring device 1 and processing unit 2, in each case driver and receiver modules S, E necessary for the data transmission are connected.

If only a single (e.g., bidirectionally operated differential) pair of lines is provided for transmitting data between position-measuring device 1 and processing unit 2, this is referred to as a two-wire interface. Interfaces which are based on transmitting data using two (differential) pairs of lines are referred to as four-wire interfaces.

Furthermore, as illustrated in FIG. 1, pairs of lines 31, 32; 33, 34 of data-transmission channel 3 are each assigned pull-up resistors 11, 13, 21 and pull-down resistors 12, 14, 22 by which, in each case, the one line 31 or 33 of a respective pair of lines 31, 32; 33, 34 is connected to an upper electric potential (voltage level) and the other line 32, 34 of corresponding pair of lines 31, 32; 33, 34 is connected to a lower potential, in the present example, to ground.

Generally expressed, resistors 11, 12; 13, 14; 21, 22 are used—when the assigned transmitter modules S are in the inactive (high-resistance) state (which is determined with the aid of the digital level at the corresponding input OC of the respective transmitter module)—to connect the two lines 31 and 32 or 33 and 34 of a respective pair of lines in each case to a defined electric potential.

Moreover, in order to be able to damp signal reflections on the specified lines, pairs of lines 31, 32 and 33, 34 are each assigned a terminating resistor 10, 20, 25, in each case on the side at which data is able to be received, thus, in the case of first pair of lines 31, 32 (bidirectionally operated data line) both on the side of position-measuring device 1 and on the side of processing unit 2, and in the case of second pair of lines 33, 34 (unidirectionally operated data line), only on the side of processing unit 2. In the arrangement illustrated in FIG. 1, a specific terminating resistor 10, 20, 25 is connected to each of the two associated lines 31 and 32 or 33 and 34 of the corresponding pair of lines.

In the configuration illustrated in FIG. 1, first pair of lines 31, 32 is connected in each case to a transmitter S and a receiver E, both on the side of position-measuring device 1 and on the side of processing unit 2, so that this pair of lines 31, 32 may be operated bidirectionally, which permits data to be transmitted both from position-measuring device 1 to processing unit 2, and vice versa, from processing unit 2 to position-measuring device 1. In contrast, only one transmitter S is connected to second pair of lines 33, 34 on the side of position-measuring device 1 and only one receiver E is connected to second pair of lines 33, 34 on the side of processing unit 2, so that exclusively a unidirectional data transmission from position-measuring device 1 to processing unit 2 is possible.

Before explaining below in greater detail, with reference to FIG. 1, a detection unit 4 which is assigned to position-measuring device 1 and by which it is determinable whether position-measuring device 1 is connected to processing unit 2 only via first pair of lines 31, 32, or additionally, also via second pair of lines 33, 34, first of all, three interface variants which may be used for the connection between a position-measuring device 1 and a processing unit 2 are explained with reference to FIGS. 2A to 2C. The interfaces illustrated in FIGS. 2A and 2B (referred to as 4-wire interfaces) are each based on a connection between position-measuring device 1 and processing unit 2 via two pairs of lines 31, 32; 33, 34, while the configuration illustrated in FIG. 2C is based on a connection of position-measuring device 1 and processing unit 2 via only one pair of lines 31, 32 (2-wire interface).

Figure 2A:
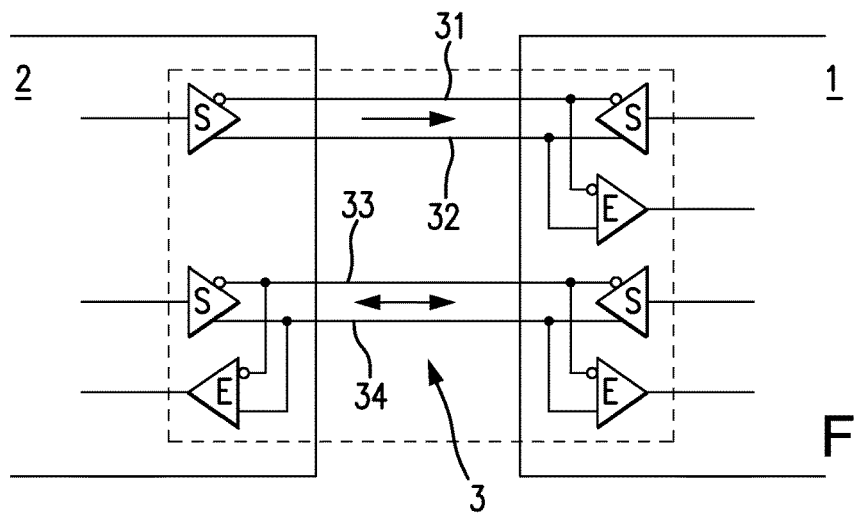
FIG. 2A schematically illustrates an arrangement of the data-transmission channel illustrated in FIG. 1.
Figure 2B:
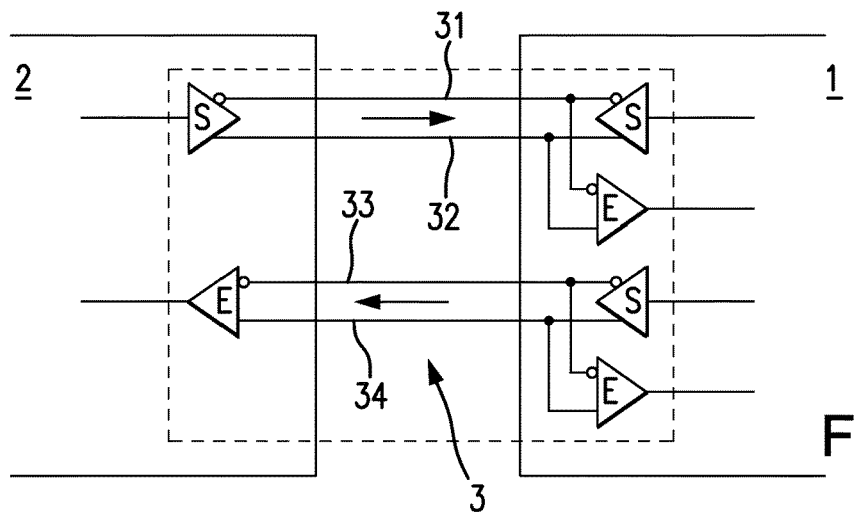
FIG. 2B schematically illustrates another arrangement of the data-transmission channel illustrated in FIG. 1.
Figure 2C:
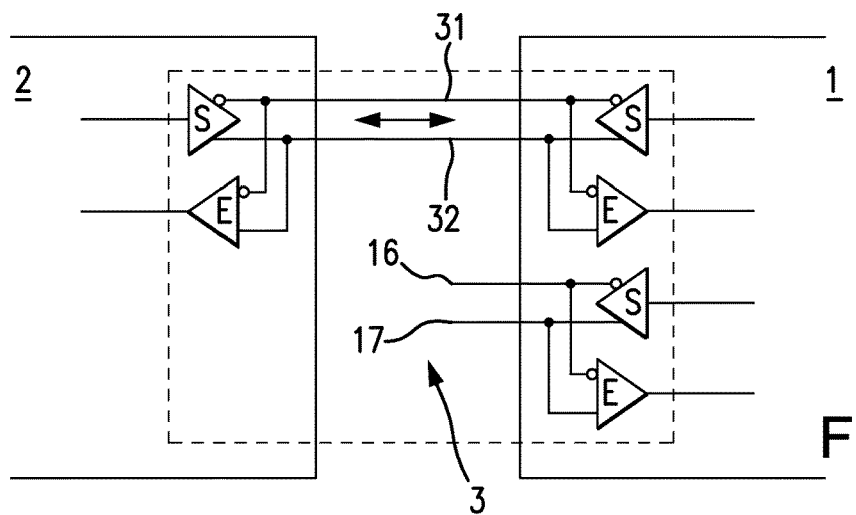
FIG. 2C schematically illustrates a further arrangement of the data-transmission channel illustrated in FIG. 1.

In the purely schematic illustrations in FIGS. 2A to 2C, which are used to describe different interface arrangements on the basis of the number of pairs of lines of transmission channel 3 as well as associated transmitters S and receivers E, the further components, including the resistors illustrated in FIG. 1, are omitted for the sake of clarity.

Position-measuring device 1 is identical in the respective arrangements illustrated in FIGS. 2A to 2C in so far as, in each case, a transmitter S and a receiver E are assigned there to each pair of lines 31, 32 and 33, 34 to be connected on the side of the position-measuring device. In principle, respective position-measuring device 1 is thus capable both of transmitting data to processing unit 2 and of receiving data from the latter via a pair of lines 31, 32 and/or 33, 34 to be connected in each case.

However, the individual configurations illustrated in FIGS. 2A to 2C differ as to whether respective position-measuring device 1 is connected to associated processing unit 2 via two pairs of lines 31, 32; 33, 34 (in the case of FIGS. 2A and 2B) or via only one pair of lines 31, 32 (in the case of FIG. 2C). In addition, the two first-named configurations having a 4-wire interface, as illustrated in FIGS. 2A and 2B, differ from each other as to the extent to which a specific pair of lines is operated unidirectionally or bidirectionally, which is a function of the form of the respective interface including the arrangement of transmitter and receiver modules S, E on the side of processing unit 2.

For example, FIG. 2A shows an interface (EnDat) between a position-measuring device 1 and a processing unit 2 having a unidirectionally operated first pair of lines 31, 32 and a bidirectionally operated second pair of lines 33, 34, as described, for example, in European Published Patent Application No. 0 660 209, which is expressly incorporated herein in its entirety by reference thereto. For example, unidirectionally operated pair of lines 31, 32 may be used for transmitting clock signals from processing unit 2 to position-measuring device 1, by which the data transmission is synchronized on (bidirectionally operated) second pair of lines 33, 34.

FIG. 2B schematically illustrates an interface (SSI) having two unidirectionally operated pairs of lines 31, 32 and 33, 34, as described, for example, in European Published Patent Application No. 0 171 579, which is expressly incorporated herein in its entirety by reference thereto.

Regarding the (2-wire) interface illustrated in FIG. 2C, reference is made to German Published Patent Application No. 10 2008 027 902, which is expressly incorporated herein in its entirety by reference thereto, according to which position-measuring device 1 and processing unit 2 are connected only via first (bidirectionally realized) pair of lines 31, 32.

The present example concerns determining, with the aid of a detection unit assigned to position-measuring device 1, such as, for example, detection unit 4 shown schematically in FIG. 1, the number of pairs of lines of data-transmission channel 3 via which position-measuring device 1 is connected to processing unit 2. To that end, in the present example, the circumstance is utilized that for a (digital) data transmission via pairs of lines, e.g., the differential transmission of serial data, a terminating resistor to damp signal reflections on the lines in question is disposed regularly on the side of a respective receiver of the data transmitted via a specific pair of lines 31, 32 or 33, 34.

As an example, FIG. 1 illustrates a detection unit 4, with which it is determinable whether second pair of lines 33, 34 of data-transmission channel 3 is present with a terminating resistor 25 on the side of processing unit 2. If such a resistor 25 is detectable by detection unit 4, this means that position-measuring device 1 is (also) connected via second pair of lines 33, 34 to processing unit 2, as in the case of the interfaces shown in FIGS. 2A and 2B, for example.

On the other hand, if no terminating resistor assigned to second pair of lines 33, 34 is detectable by detection unit 4 on the side of processing unit 2, this means, as illustrated in FIG. 2C, that no corresponding pair of lines is connected to those terminal leads 16, 17 of the position-measuring device which are used for the connection of a second pair of lines 33, 34 for transmitting data to processing unit 2.

In the example illustrated in FIG. 1, detection unit 4 is arranged such that, with it, the electric potential (the voltage level) on a line 34 of second pair of lines 33, 34 is able to be determined when second pair of lines 33, 34 is connected (via terminal leads 16, 17, see FIG. 2C) to position-measuring device 1, and connects it to processing unit 2.

To that end, detection unit 4 engages with the terminal 17, compare FIG. 2C, of position-measuring device 1 which, given the presence of a second pair of lines 33, 34, is to be connected with corresponding line 34 of that pair.

In this example, detection unit 4 includes a comparator 40 whose one input 40*a* engages, via corresponding terminal 17 of position-measuring device 1, with a line 34 of second pair of lines 33, 34, provided that pair of lines 33, 34 is connected to the position-measuring device, and whose other input 40*b* is at a reference potential that is provided, for example, by two resistors 41, 42 which are connected in series. By comparing the voltage level present at the one input 40*a* with the reference level present at the other input 40*b*, comparator 40 generates an output signal that indicates whether the one input 40*a* is connected to a pair of connecting lines 33, 34, to which, in turn, a terminating resistor 25 is assigned (that in this example, is connected to each of the two lines of specified pair of connecting lines 33, 34).

In corresponding manner, with the aid of a detection unit 4, it is possible to determine for any pair of lines 31, 32; 33, 34 of a data-transmission channel 3, whether the corresponding pair of lines is present for the connection of position-measuring device 1 to processing unit 2, by determining whether an electric potential or a voltage level that is attributable to a terminating resistor 25 assigned to corresponding pair of lines 33, 34 is registered at a detection unit 4 that has a comparator 40 and that engages with the pair of lines 31, 32 or 33, 34 to be detected in each case, when the pair of lines is present for the connection of position-measuring device 1 to processing unit 2.

As described above, the detection of terminating resistor 25 is carried out advantageously in the case of driver module (transmitter S) switched to inactive (high-resistance) at corresponding pair of lines 33, 34, for example, in the case of FIG. 1, given an inactive transmitter S on the side of position-measuring device 1. The intention is thereby to prevent transmitter S from influencing the voltage level on relevant pair of lines 33, 34.

If a specific transmitter S, connected to pair of lines 33, 34 considered, is inactive or high-resistance, then in the present example, the voltage level of the lines of pair of lines 33, 34 affected is determined by pull-up resistor 13, pull-down resistor 14 and, if present, by terminating resistor 25. Without terminating resistor 25 (i.e., if no connection exists with processing unit 2 via second pair of lines 33, 34), one terminal which is assigned to the one line 34 is connected to ground potential by pull-down resistor 14, and one terminal which is assigned to the other line 33 is connected by pull-up resistor 13 to a voltage potential Up differing from that. On the other hand, if a connection is produced with processing unit 2 via second pair of lines 33, 34, then the two aforesaid resistors 13, 14, together with terminating resistor 25 now additionally provided, form a voltage divider. In this manner, for example, the potential on one line 34 may be raised and on the other line 33 may be lowered. The presence of terminating resistor 25 is able to be detected due to the influencing of the voltage potentials on the lines of pair of lines 33, 34 to be detected.

In contrast, if transmitter S (e.g., on the side of position-measuring device 1) is switched to active, that is, if it would generate a logical high or low level, then the potential of the lines of pair of lines 33, 34 considered would be determined substantially by transmitter S, and reliable detection of terminating resistor 25 by detection unit 4 would be rendered difficult.

As an alternative to detecting a specific voltage or a voltage level, it may also be provided, for example, to generate a current signal (in position-measuring device 1) that would be transmitted by corresponding pair of lines 33, 34 and associated terminating resistor 25 according to a type of electric circuit, provided the latter are connected to position-measuring device 1.

In the following, two modifications of the position-measuring device illustrated in FIG. 1 are described with reference to FIGS. 3 and 4, and specifically, in each case with a view to the form of detection unit 4, by which it is possible to determine by how many pairs of lines of data-transmission channel 3 position-measuring device 1 is connected to associated processing unit 2. In the arrangement illustrated in FIG. 1, detection unit 4 is configured to determine whether position-measuring device 1 is (also) connected via second pair of lines 33, 34 of data-transmission channel 3 to processing unit 2, and specifically, by detecting a terminating resistor 25 (on the processing side).

Figure 3:
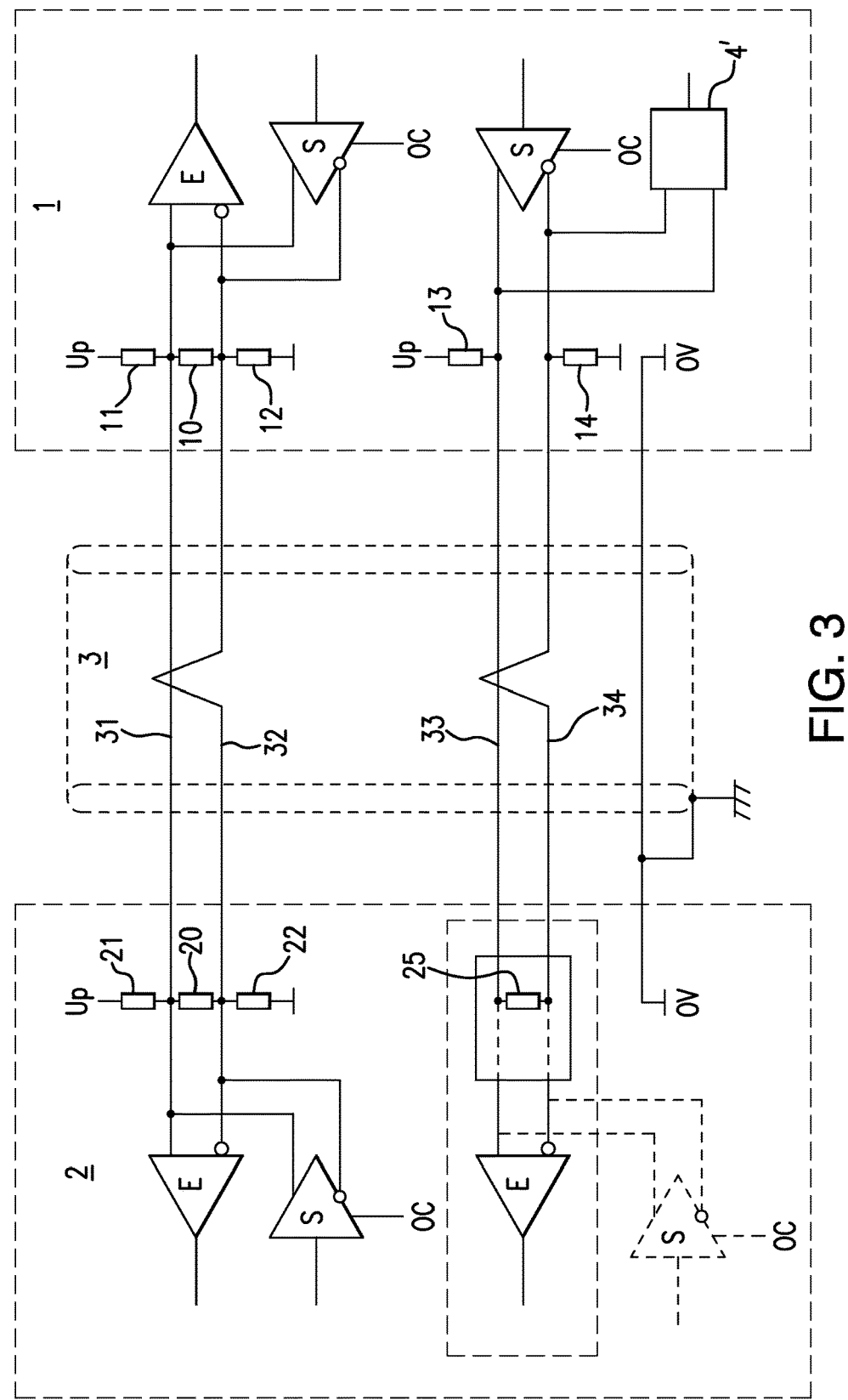
FIG. 3 schematically illustrates a position-measuring device, modified from the device illustrated in FIG. 1.
Figure 4:
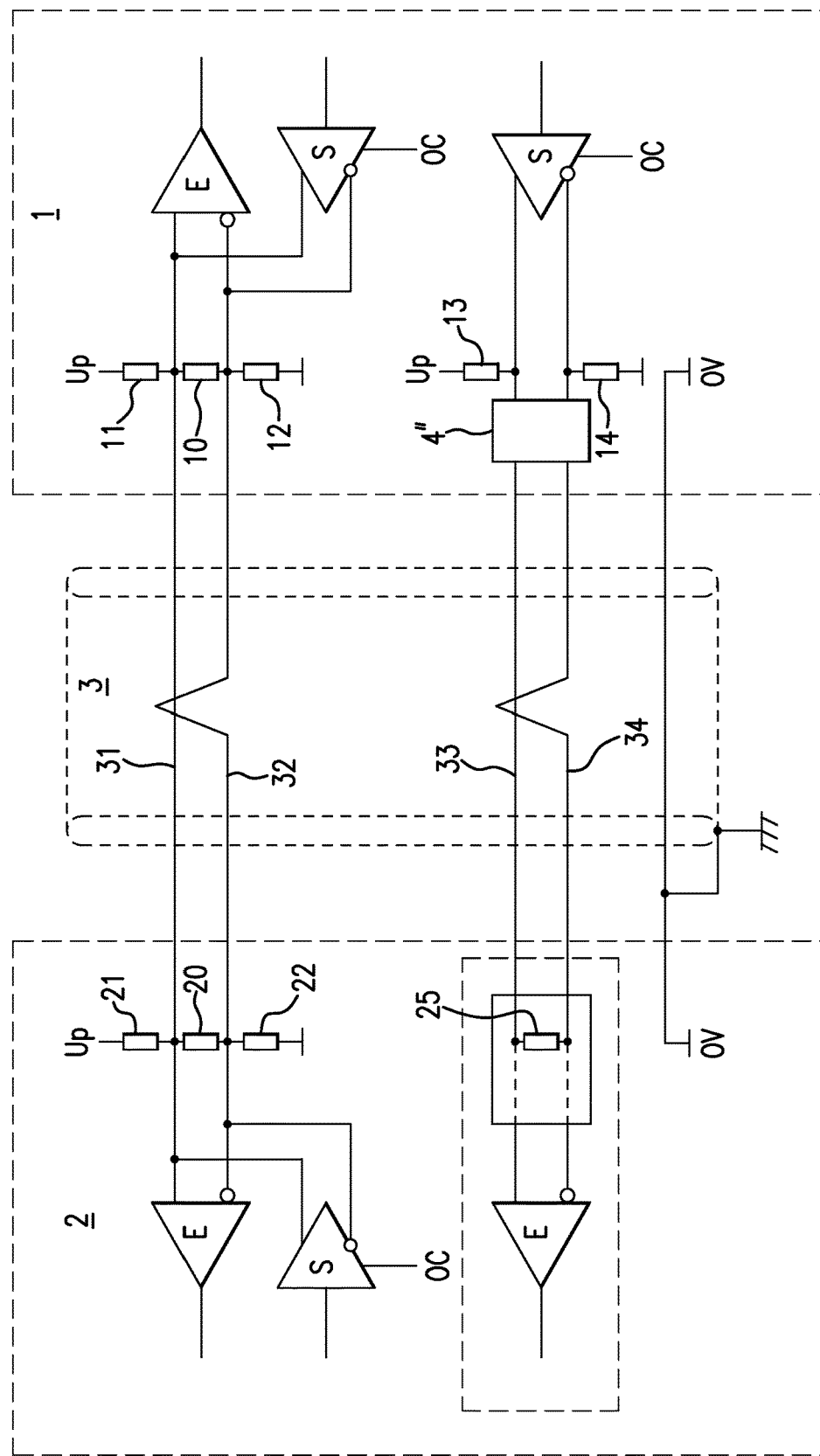
FIG. 4 schematically illustrates a position-measuring device, modified from the device illustrated in FIG. 1.

The exemplary embodiments illustrated in FIGS. 3 and 4 differ from the arrangement illustrated in FIG. 1, in each instance in the form of the detection unit which in FIG. 3 is denoted by reference numeral 4', and in FIG. 4 by reference numeral 4". In all other respects, the arrangements illustrated in FIGS. 3 and 4 correspond with the arrangement illustrated in FIG. 1. In each case, the same reference numerals are used as in FIG. 1 for corresponding components and modules in FIGS. 3 and 4.

As illustrated in FIG. 3, detection unit 4' (assigned to position-measuring device 1) takes the form of a unit for measuring the voltage difference between the two lines 33, 34 of corresponding (second) pair of lines 33, 34 of data-transmission channel 3. The voltage difference measured by detection unit 4' may be compared, for example, to a threshold value stored in detection unit 4' (or perhaps externally), or may be evaluated in any other manner. On the basis of the voltage difference at terminals 16, 17 of position-measuring device 1 (compare FIG. 2c), via which processing unit 2 is connectable with the aid of an (additional) second pair of lines, it is possible to determine directly whether or not such a line connection exists. Namely, the voltage difference at the two terminals 16, 17 on the position-measuring-device side for second pair of lines 33, 34 is a function of whether a pair of lines, via which a connection is produced to the processing unit, is actually connected there or not.

In this manner, not only (in the case of an inactive transmitter module S on the side of position-measuring device 1) may a possible terminating resistor 25 be detected, which is disposed (on the side of processing unit 2) between the lines of second pair of lines 33, 34. Rather, for example, an active transmitter module S (on the side of processing unit 2), as indicated by a broken line in FIG. 3, which is connected via second pair of lines 33, 34 to position-measuring device 1, may also be detected directly.

It may be that, in principle, the direct detection of a processing-side transmitter module S connected via second pair of lines 33, 34 is also possible with the aid of detection unit 4 illustrated in FIG. 1, which includes a comparator 40. However, additional expenditure is associated with it. Since transmitter modules regularly transmit differential (not referenced to ground) signals, the assumption cannot readily be made that in the arrangement illustrated in FIG. 1, the voltage at input 40a of comparator 40 acting as pickoff reliably exceeds the threshold value of the voltage at the other input 40b—depending on the selection of the threshold value. Therefore, in the case of the arrangement illustrated in FIG. 1, it may be difficult to set the threshold value in a manner that an active transmitter module S on the side of processing unit 2 is detected reliably.

In the case of the exemplary embodiment illustrated in FIG. 4, detection unit 4" (on the side of position-measuring device 1) is in the form of a device for measuring the characteristic impedance, i.e., the impedance or the reflection properties of the lines of (second) pair of lines 33, 34 to be detected. It is thereby possible both to determine whether second pair of lines 33, 34 is connected to position-measuring device 1, and to ascertain whether a terminating resistor 25 assigned to that pair of lines is actually provided (in the circuit).

What is claimed is:

1. A position-measuring device for determining a position of two objects movable relative to each other, which during operation, generates data in the form of measured position values, the position-measuring device connectable to a processing unit via a differential data-transmission channel in order to transmit data, the position-measuring device connectable to the processing unit via (a) a first pair of lines of the differential data-transmission channel or (b) a first pair of lines of the differential data-transmission channel and at least one further pair of lines of the differential data-transmission channel, the position-measuring device comprising:

a detection unit adapted to detect a presence or non-presence of at least one further pair of lines of the differential data transmission channel, when the position-measuring device is connected to the processing unit via the differential data-transmission channel, by detection of a terminating resistor that is located in the processing unit and that is provided in the presence of the further pair of lines of the differential data transmission channel;

wherein the terminating resistor connects the lines of the further pair of lines to each other;

wherein the detection unit is adapted to detect the presence of the further pair of lines by checking whether the pair of lines and the terminating resistor form an electric circuit; and wherein the detection unit includes a voltage source adapted to impart a voltage on at least one of the further pair of lines and a comparator adapted to compare the voltage on at least another one of the further pair of lines to a reference voltage to check whether the terminating resistor, that is located in the processing unit, and the further pair of lines form an electric circuit.

2. The position-measuring device according to claim 1, wherein the detection unit is adapted to detect whether a pair of lines, which connects the position-measuring device to the processing unit, is connected to at least one specifiable terminal of the position-measuring device.

3. The position-measuring device according to claim 1, wherein the detection unit is arranged as a component of the position-measuring device.

4. The position-measuring device according to claim 1, wherein the detection unit is adapted to detect whether the electric circuit is connected to a terminal of the position-measuring device.

5. The position-measuring device according to claim 1, wherein the detection unit is adapted to detect an electric potential which is modified based on presence of the terminating resistor.

6. The position-measuring device according to claim 1, wherein one input of the comparator is connected to a terminal lead of a terminal of the position-measuring device, and another input of the comparator is connected to a reference-potential indicator.

7. The position-measuring device according to claim 1, wherein the detection unit is adapted to detect a characteristic impedance and/or reflection properties of the further pair of lines.

8. The position-measuring device according to claim 1, wherein the data transmission channel is configured for a digital serial data transmission.

9. The position-measuring device according to claim 1, further comprising a transmitter adapted to transmit data to the processing unit via the further pair of lines, wherein the transmitter is switched to an inactive state during the detection by the detection unit of the presence or non-presence of the further pair of lines, so that the transmitter does not influence a voltage on the further pair of lines during the detection.

10. A position-measuring device for determining a position of two objects movable relative to each other, which during operation, generates data in the form of measured position values, the position-measuring device connectable to a processing unit via a differential data-transmission channel in order to transmit data, the position-measuring device connectable to the processing unit via (a) a first pair of lines of the differential data-transmission channel or (b) a first pair of lines of the differential data-transmission channel and at least one further pair of lines of the differential data-transmission channel, the position-measuring device comprising:

a detection unit adapted to detect a presence or non-presence of at least one further pair of lines of the differential data transmission channel, when the position-measuring device is connected to the processing unit via the differential data-transmission channel, by detection of a terminating resistor that is located in the processing unit and that is provided in the presence of the further pair of lines of the differential data transmission channel;

wherein the terminating resistor connects the lines of the further pair of lines to each other;

wherein the detection unit is adapted to detect the presence of the further pair of lines by checking whether the pair of lines and the terminating resistor form an electric circuit; and wherein the detection unit is adapted to determine a voltage difference between the lines of the further pair of lines.

11. The position-measuring device according to claim 10, wherein the detection unit is adapted to compare the voltage difference to a threshold value.

12. A method for detecting a number of pairs of lines by which a position-measuring device is connected to a processing unit in order to be able to transmit data between the position-measuring device and the processing unit during operation, the connection of the position-measuring device to the processing unit for an intended operation being provided by (a) a first pair of lines of a differential data transmission channel or (b) a first pair of lines of the differential data transmission channel and at least one further pair of lines of the differential data transmission channel, comprising:

detecting, by a detection unit assigned to the position-measuring device, a presence or non-presence of at least one further pair of lines, when the position-measuring device is connected to the processing unit for differential data transmission as intended, by detecting a terminating resistor that is located in the processing unit and that is provided in the presence of the further pair of lines;

wherein the terminating resistor connects the lines of the further pair of lines to each other;

wherein the detection unit is adapted to detect the presence of the further pair of lines by checking whether the pair of lines and the terminating resistor form an electric circuit; and wherein the detection unit includes a voltage source and a comparator, the detecting including imparting, by the voltage source, a voltage on at least one of the further pair of lines, and comparing, by the comparator, the voltage on at least another one of the further pair of lines to a reference voltage to check whether the terminating resistor, that is located in the processing unit, and the further pair of lines form an electric circuit.

13. The method according to claim 12, further comprising determining, with the aid of the detection unit, whether a pair of lines, which connects the position-measuring device to the processing unit, is connected to at least one specifiable terminal of the position-measuring device.

14. The method according to claim 12, wherein the position-measuring device includes a transmitter adapted to transmit data to the processing unit via the further pair of lines, the method further comprising switching a transmitter of the position-measuring device to an inactive state during the detection by the detection unit of the presence or non-presence of the further pair of lines, so that the transmitter does not influence a voltage on the further pair of lines during the detection.

15. A system, comprising:
a differential data-transmission channel;
a processing unit; and
a position-measuring device adapted to determine a position of two objects movable relative to each other and to generate, during operation, data in the form of measured position values, the position-measuring device connected to the processing unit via the differential data-transmission channel in order to transmit data, the position-measuring device connected to the processing unit via (a) a first pair of lines of the differential data transmission channel or (b) a first pair of lines of the differential data transmission channel and at least one further pair of lines of the differential data transmission channel, the position-measuring device including a detection unit adapted to detect a presence or non-presence of at least one further pair of lines, by detection of a terminating resistor that is located in the processing unit side and that is provided in the presence of the further pair of lines;

wherein the terminating resistor connects the lines of the further pair of lines to each other;

wherein the detection unit is adapted to detect the presence of the further pair of lines by checking whether the pair of lines and the terminating resistor form an electric circuit; and wherein the detection unit includes a voltage source adapted to impart a voltage on at least one of the further pair of lines and a comparator adapted to compare the voltage on at least another one of the further pair of lines to a reference voltage to check whether the terminating resistor, that is located in the processing unit, and the further pair of lines form an electric circuit.

16. The system according to claim 15, wherein the position-measuring device includes a transmitter adapted to transmit data to the processing unit via the further pair of lines, wherein the transmitter is switched to an inactive state during the detection by the detection unit of the presence or non-presence of the further pair of lines, so that the transmitter does not influence a voltage on the further pair of lines during the detection.

* * * * *